United States Patent [19]

Yamada et al.

[11] Patent Number: 4,796,267
[45] Date of Patent: Jan. 3, 1989

[54] LASER CONTROL CIRCUIT

[75] Inventors: Fumiaki Yamada; Masato Hosobuchi, both of Kodaira, Japan

[73] Assignee: Nakamichi Corporation, Tokyo, Japan

[21] Appl. No.: 36,619

[22] Filed: Apr. 10, 1987

[30] Foreign Application Priority Data

Apr. 11, 1986 [JP] Japan .................. 61-53483[U]
Oct. 8, 1986 [JP] Japan .................. 61-153730[U]

[51] Int. Cl.⁴ ............................................. H01S 3/00
[52] U.S. Cl. ................................. 372/38; 372/31; 369/116
[58] Field of Search ........................ 372/29, 31, 38; 369/106, 107, 116, 54

[56] References Cited

U.S. PATENT DOCUMENTS

| | | | |
|---|---|---|---|
| 4,093,961 | 6/1978 | Kanamaru | 358/128 |
| 4,114,180 | 9/1978 | Kayanuma | 358/128 |
| 4,283,785 | 8/1981 | Miyauchi et al. | 369/116 |
| 4,554,654 | 11/1985 | Kato | 369/54 |
| 4,701,609 | 10/1987 | Koishi et al. | 369/116 |
| 4,709,417 | 11/1987 | Kuwabara | 369/116 |

Primary Examiner—William L. Sikes
Assistant Examiner—B. Randolph
Attorney, Agent, or Firm—Sughrue, Mion, Zinn, Macpeak & Seas

[57] ABSTRACT

Disclosed is a laser control circuit used for an optical disc player. The laser output is digitally modulated, when recording to have high and low levels. The invention provides the laser control circuit capable of controlling the high level and the low level. The circuit is provided with a negative feedback loop in order to stabilize the laser output. Although such negative feedback loop stabilizes the average level of the laser output, the high and low levels may be fluctuated sometimes thereby. The invention also provides for supressing such level fluctuation.

2 Claims, 3 Drawing Sheets

LASER CONTROL CIRCUIT

BACKGROUND OF THE INVENTION

The present invention relates generally to a laser control circuit in a recordable optical disc player, and more particularly to the circuit for controlling laser output of variable high level and low level.

The recordable optical disc may be formed of various composition materials at the record surface thereof and have various recording sensitivities depending on the composition materials. When making records on such an optical disc, the optimum laser output of the high level therefor is also varied depending on the composition materials. The optical disc player, thus, should be adapted so as to generate the optimum laser output at the high level depending on the optical disc to be used, and consequently the laser output of the high level should be adapted to be controllable for that purpose.

On the other hand, the optical disc player must be capable of generating the predetermined level output, during generation of the low level output, so as to make the tracking and focussing controls possible during the recording operation. It is desired, thus, to provide a laser control circuit whereby the high level output may be controlled while keeping the low level output constant.

Additionally, in order to stabilize the laser output, in view of the fact that laser element properties are varied depending on ambient conditions such as temperature, there has been used in general a negative feedback loop in the laser output circuit. This negative feedback circuit, however, may sometimes adversely affect laser output control.

SUMMARY OF THE INVENTION

An object of the invention is, thus, to provide a laser control circuit which may control the high level output while keeping the low level output constant.

Another object of the invention is to provide a laser control circuit capable of stabilizing the laser output without adversely affecting on laser output control.

These objects of the invention can be attained under recognition of the following. In the laser control circuit according to the invention, for optical disc recording, there is applied an amplitude setting voltage to decide a pulse amplitude and a low level setting voltage. The amplitude setting voltage is adapted to be variable but the low level setting voltage may be variable or fixed according to the intention of the invention.

In the laser control circuit, there is used a negative feedback loop to control the detected light quantity of the laser output thereby to be proportional to the sum of the amplitude setting voltage and low level setting voltage. Additionally, an average light quantity control voltage applied on an amplifier for directly driving laser is added with a modulation voltage based on the digital recording signal to modulate the laser output. The amplitude of said modulation voltage is set to be proportional to the amplitude setting voltage and two times the average light quantity control voltage to be generated when making the negative feedback control in order that the average light quantity may be proportional only to the amplitude setting voltage.

It is thus made possible in the laser control circuit of the invention that the laser output of the constant low level may be generated when keeping the low level setting voltage constant, that when varying the low level setting voltage the low level output only may be made variable with the constant amplitude on the one hand and that when varying the amplitude setting voltage the high level output only may be made variable with the constant low level on the other hand.

It is added that since the average light quantity is kept constant at a desiredly set level according to the negative feedback control, in case where a duty ratio of the digital recording signal is fluctuated both the high and low levels are accordingly fluctuated. In order to prevent the levels from fluctuating, a signal representing such duty ratio is taken out of the digital recording signal to be used for correction of the average light quantity, in the laser control circuit of the invention, so as to stabilize the laser output.

The invention will be more definitely explained as to preferred embodiments thereof in reference to the accompanying drawings.

DESCRIPTION OF THE PREFERRED EMBODIMENT

Figure 1:
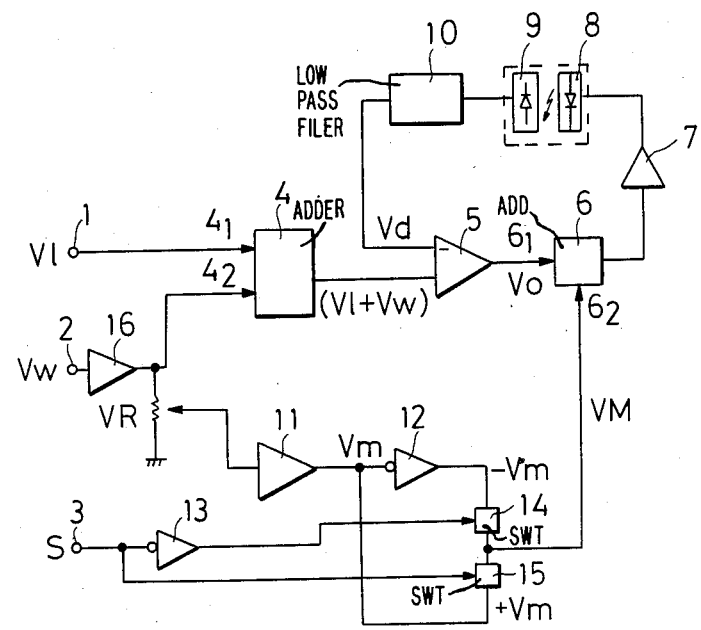
FIG. 1 is a block diagram showing the first embodiment of the laser control circuit according to the invention.

In the laser control circuit shown in FIG. 1, an input terminal 1 for applying a low level setting voltage Vl in order to establish a low level of the laser radiation is electrically connected with an input terminal $4_1$ of an adder 4. An input terminal 2 for applying an amplitude setting voltage Vw in order to establish an amplitude of the laser recording output is electrically connected with another input terminal $4_2$ of the adder 4 via a buffer amplifier 16 on the one hand and with an input terminal of an amplifier 11 via a variable resistor VR.

An output terminal of the adder 4 is connected with the plus input terminal of a differential amplifier 5 the output terminal of which is connected with an input terminal $6_1$ of a second adder 6. The output terminal of the adder 6 is connected with a laser driving amplifier 7 for current driving of a laser diode 8 depending on the inputted voltage. A photodiode 9 arranged in the vicinity of the laser diode 8 is connected with a minus input terminal of the differential amplifier 5 via a low-pass filter 10.

The output terminal of the amplifier 11 is electrically connected with one terminal of a switching element 14 via an inverter 12 and directly with one terminal of a second switching element 15. An input terminal 3 for applying a digital recording signal S of the high and low levels is connected with the control terminal of said switching element 14 via an inverter 13 and directly with the control terminal of the switching element 15. The other terminals of the two switching elements 14, 15 are connected with each other and further with another input terminal $6_2$ of the adder 6.

Behavior of the laser control circuit of the arrangement as the above will be explained in reference also to FIG. 2.

In the low-pass filter 10, current, which is outputted from the photodiode 9 to be proportional to the intensity of luminance generated by the laser diode 8, is inputted from the photodiode 9 so as to output voltage Vd corresponding to the average light quantity which is obtained by eliminating the digital recording signal component.

Assuming that there is no voltage impressed on the input terminal $6_2$ of the adder 6, the laser diode 8 is controlled according to negative feedback by comparing the voltage Vd with the added voltage (V1+Vw) outputted by the adder 4, so as to generate the laser radiation output of the average light quantity level $P_2$ proportional to the output voltage (V1+Vw) of the adder 4, which is represented by an equality;

$$P_2 = K_1 \cdot (Vl + Vw) \quad (1)$$

In this equation, $K_1$ represents a constant to be decided depending on a sensitivity of the photodiode 9, a gain of the low-pass filter 10 and the like. It is noted that the low level setting voltage Vl of the added voltage in the equation is that corresponding to a low level light quantity $P_1$ in FIG. 2.

Across each one of the terminals of the switching elements 14, 15 are respectively impressed voltages −Vm and +Vm proportional to the amplitude setting voltage Vw and adjustable by the variable resistor VR. When the digital recording signal S is applied on the input terminal 3 in this state, the switching element 15 is in the condition of a short circuit and the switching element 14 is in the open condition so that the plus voltage, +Vm is applied on the input terminal $6_2$ of the adder 6 in the high level situation, while the minus voltage, −Vm is applied on the terminal $6_2$ in the low level situation where the switching elements conversely operate. The modulation voltage, VM consisting of +Vm and −Vm is added to an average light quantity control voltage Vo, which is outputted from said differential amplifier 5 in order to generate laser radiation of the average light quantity level $P_2$ according to negative feedback control to modulate the laser radiation on the basis of the digital recording signal S. The modulated amplitude Pw is proportional to the amplitude setting voltage Vw, which is represented by;

$$Pw = K_2 \cdot Vw \quad (2)$$

in which said $K_2$ is a constant to be established according to adjustment of the variable resistor VR. Owing to this resistor VR, the modulated amplitude Pw is set in advance to be twice the difference between the average light quantity level $P_2$ and the low light quantity level $P_1$.

When raising or lowering the amplitude setting voltage Vw applied on the input terminal 2, thus, the average light quantity level $P_2$ is increased or decreased in proportion thereto and the modulated amplitude Pw of the laser radiation modulated based on the digital recording signal S is also proportionally extended or reduced.

Figure 2:
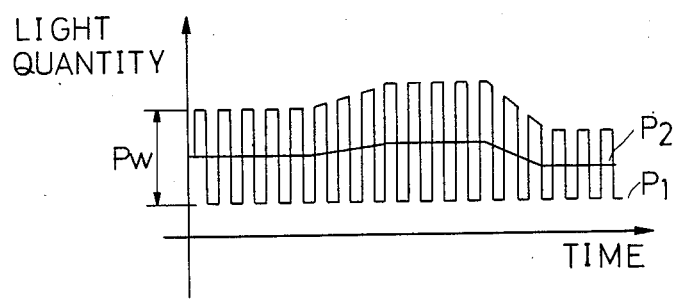
FIG. 2 is a graph showing waveforms and the behavior of said circuit.

Accordingly the light quantity level of the laser radiation in the low level state corresponding to the low level state of the digital recording signal S may constantly keep the low light quantity level P1 established by the low level setting voltage Vl as shown in FIG. 2.

When increasing or decreasing the low level setting voltage Vl impressed on the input terminal 1, the low light quantity level $P_1$ is varied in proportion thereto while the modulated amplitude Pw is kept constant.

According to the laser control circuit as explained above, thus, it is possible to control the modulated amplitude Pw while keeping the light quantity level of the laser radiation corresponding to the digital recording signal S in the low state at the low light quantity level $P_1$, and control the light quantity level in the low output level with keeping modulated amplitude of the laser radiation in constant.

Furthermore, since the laser radiation average light quantity level $P_2$ is controlled in the negative feedback, the desired level may be kept constant despite that the characteristics of the laser diode are fluctuated by the ambient conditions.

Figure 3:
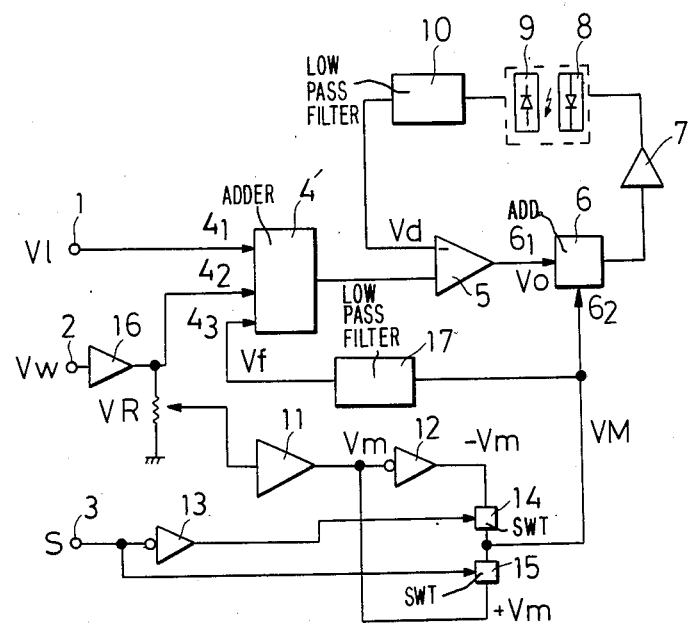
FIG. 3 is a block diagram showing the second embodiment.

A second embodiment of the laser control circuit according to the invention is illustrated in FIG. 3, in which the same elements as shown in FIG. 1 are designated by the same reference numerals. The explanation of the same elements will not be repeated hereafter.

Figure 4:
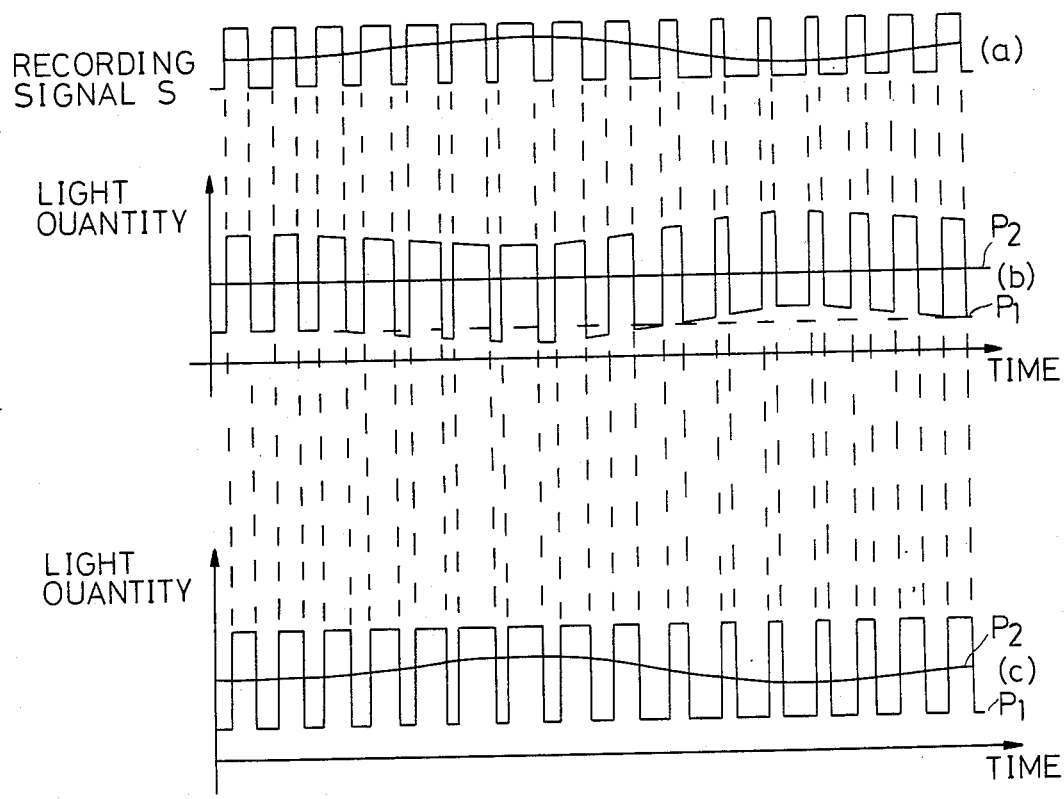
FIG. 4 is a graph showing the behavior thereof.

In the first embodiment in FIG. 1, there is a possibility of that the negative feedback loop may adversely affect on the laser control. As suggested at the beginning of the specification, the duty ratio of the digital recording signal S and consequently the average level thereof is fluctuated as shown in FIG. 4(a). When modulating the laser radiation with such digital recording signal S, the average light quantity level $P_2$ is also to be fluctuated. However the negative feedback loop may supress such fluctuation so that the average light quantity level may be made constant as shown in FIG. 4(b), but the laser output at the high level and the low level may be fluctuated.

In order to prevent such undesired effect, the average value of the digital recording signal S is detected in advance to correct the laser driving voltage according to another aspect of the invention.

In the second embodiment shown in FIG. 3, there is provided another low-pass filter 17 the input terminal of which is electrically connected with a second input terminal $6_2$ of the adder 6. The low-pass filter 17 may thus receive the modulated voltage VM from which a fluctuated average voltage Vf of the digital recording signal S can be formed. This average voltage Vf is thus proportional to the fluctuating average level of which fluctuation corresponds to the duty ratio change of the digital recording signal S shown in FIG. 4(a). As apparent from comparison of FIGS. 4(a) and (b), the fluctuations of the average level of the digital recording signal S and of the modulated laser output are proportional with each other and in the opposite phase. Thus, the average voltage Vf is impressed on input terminal $4_3$ of the adder 4 so that the added voltage to be outputted as (V1+Vw+Vf) is formed, and the average light quantity level $P_2$ to be controlled with the negative feedback is fluctuated thereby, when the gain in the low-pass filter 17 is set in advance so that the fluctuation of the average light quantity level $P_2$ is to coincide with that of the modulated laser output shown in FIG. 4(b), which makes it possible to exclude the fluctuation of the modulated laser output as shown in FIG. 4(c).

It is added that the above are only a few examples of the laser control circuit of the invention which is not restricted to the above and that various modifications are made possible within the scope of the invention as claimed in the followings. For instance, it is possible to add a voltage of opposite phase against the average voltage Vf to the voltage Vd impressed on the minus input terminal of the differential amplifier 5.

What is claimed is:

1. A laser control circuit comprising:
   a laser source,
   means for detecting an average light quantity of a laser beam emitted from said laser source to produce an average light quantity signal,
   comparing means for producing an average light quantity control signal which is a difference between a reference signal and the average light quantity signal,
   means for outputting a modulation signal based on a recording signal of high and low levels,
   modulating means for outputting a laser control modulation signal by adding the average light quantity control signal to the modulation signal,
   means for driving the laser source in accordance with the laser control modulation signal,
   said detecting means and comparing means constituting a negative feedback circuit so that the average light quantity control signal follows the reference signal,
   means for detecting information on fluctuation on an average level of said modulation signal based on a duty ratio change of said recording signal of high and low levels to output a fluctuation signal proportional to said detected information on fluctuation, and
   means for correcting said average light quantity based on said fluctuation signal.

2. The laser control circuit as set forth in claim 1, in which said correcting means corrects said average light quantity by adding said fluctuation signal to said reference signal.

* * * * *